(12) United States Patent
Kraiss

(10) Patent No.: US 9,883,756 B2
(45) Date of Patent: Feb. 6, 2018

(54) RACK SYSTEM HAVING AN ELECTRICAL SUPPLY

(71) Applicant: JUVEMA AG, Kreuzlingen (CH)

(72) Inventor: Hans Kraiss, Bad Urach-Wittlingen (DE)

(73) Assignee: Juvema AG, Salenstein (CH)

( * ) Notice: Subject to any disclaimer, the term of this patent is extended or adjusted under 35 U.S.C. 154(b) by 0 days.

(21) Appl. No.: 15/106,138

(22) PCT Filed: Dec. 16, 2014

(86) PCT No.: PCT/EP2014/078073
§ 371 (c)(1),
(2) Date: Jun. 17, 2016

(87) PCT Pub. No.: WO2015/091557
PCT Pub. Date: Jun. 25, 2015

(65) Prior Publication Data
US 2016/0316939 A1  Nov. 3, 2016

(30) Foreign Application Priority Data

Dec. 18, 2013 (DE) .......................... 10 2013 114 289
May 22, 2014 (EP) ..................................... 14169527

(51) Int. Cl.
*A47F 11/10* (2006.01)
*A47F 1/12* (2006.01)
(Continued)

(52) U.S. Cl.
CPC .............. *A47F 11/10* (2013.01); *A47B 57/42* (2013.01); *A47F 1/12* (2013.01); *A47F 5/103* (2013.01);
(Continued)

(58) Field of Classification Search
CPC ....... H01L 2924/00; H01L 2924/00014; H01L 2224/45015; H01L 2224/45144;
(Continued)

(56) References Cited

U.S. PATENT DOCUMENTS 5,348,485 A * 9/1994 Briechle ................ H01R 25/14
439/110
6,109,461 A * 8/2000 Kluge .................... A47B 57/30
211/103
(Continued)

FOREIGN PATENT DOCUMENTS

DE          3439657 A1   4/1986
DE   102007028395 A1   12/2008
(Continued)

OTHER PUBLICATIONS

European Office Action in corresponding European Application No. 14 16 9527, dated Mar. 17, 2015, 8 pages.
(Continued)

*Primary Examiner* — Adam B Dravininkas
(74) *Attorney, Agent, or Firm* — Fitch, Even, Tabin & Flannery LLP

(57) ABSTRACT

A shelving system includes at least one vertically oriented shelf rail having a row of vertical slots leading to the shelf rail interior. In the interior, a bus bar includes conductors. A carrier element, such as a shelf element, is mounted on a bracket configured to hook into the shelf rail slots. A lighting device is attached to the carrier element or the bracket. A current collection device is fastened to the bracket and includes tap contacts that protrude from a housing and are disposed on the engagement section of the bracket. The tap contacts are resilient and disposed to be elastically pressed into the housing against a spring force when the bracket is being hooked into the shelf rail, pressed out of the housing when located in the shelf rail interior, and pressed against (Continued)

associated current conductors to establish an electrically conducting connection for the lighting device.

15 Claims, 9 Drawing Sheets

(51) Int. Cl.
| | |
|---|---|
| *F21V 33/00* | (2006.01) |
| *H05K 7/14* | (2006.01) |
| *A47F 5/10* | (2006.01) |
| *A47B 57/42* | (2006.01) |
| *F21V 23/06* | (2006.01) |
| *H02B 1/20* | (2006.01) |
| *H01R 25/14* | (2006.01) |

(52) U.S. Cl.
CPC ............ *F21V 23/06* (2013.01); *F21V 33/002* (2013.01); *F21V 33/0012* (2013.01); *H02B 1/20* (2013.01); *A47B 2220/0077* (2013.01); *A47B 2220/0091* (2013.01); *H01R 25/147* (2013.01); *H05K 7/1489* (2013.01)

(58) Field of Classification Search
CPC ....... H01L 2224/48091; H01L 2924/14; G11B 33/128; H05K 7/1489; H05K 7/1492; F25D 25/02; F25D 27/00; A47F 1/12; A47F 11/10; A47F 1/125; A47F 1/04; A47F 5/0068; A47F 3/001; A47F 5/0043; A47F 3/14; A47F 5/103; A47F 5/0018; F21V 33/0012; F21V 21/35; F21V 23/06; F21V 33/002; H02B 1/20; A47B 57/42; A47B 2220/0091; A47B 2220/0077; H01R 25/147
See application file for complete search history.

(56) References Cited

U.S. PATENT DOCUMENTS

| | | | | |
|---|---|---|---|---|
| 6,364,678 | B1* | 4/2002 | Hellwig | H02G 3/0493 439/207 |
| 6,527,406 | B1* | 3/2003 | Slesinger | A47F 11/10 312/223.6 |
| 8,579,127 | B2* | 11/2013 | Dyck | A47B 57/485 211/103 |
| 2002/0085373 | A1* | 7/2002 | Slesinger | A47F 11/10 362/127 |
| 2006/0209537 | A1 | 9/2006 | Stelmasik et al. | |
| 2007/0139909 | A1* | 6/2007 | Wing | F25D 27/00 362/92 |
| 2013/0299439 | A1* | 11/2013 | Sid | A47F 5/0018 211/134 |
| 2014/0227893 | A1* | 8/2014 | Howard | A47B 97/00 439/121 |
| 2014/0292168 | A1* | 10/2014 | Nevarez | A47F 3/001 312/236 |
| 2014/0349502 | A1 | 11/2014 | Meis | |
| 2015/0201762 | A1* | 7/2015 | Walter | F21V 21/35 211/187 |

FOREIGN PATENT DOCUMENTS

| | | |
|---|---|---|
| DE | 202012008355 U1 | 10/2012 |
| WO | 2005099522 A2 | 10/2005 |
| WO | 2013087081 A1 | 6/2013 |

OTHER PUBLICATIONS

German Office Action in corresponding German Application No. 10 2013 114 289.3, dated Jun. 11, 2014, 6 pages.
International Search Report in corresponding International Application No. PCT/EP2014/078073, dated Mar. 17, 2015, 4 pages.

* cited by examiner

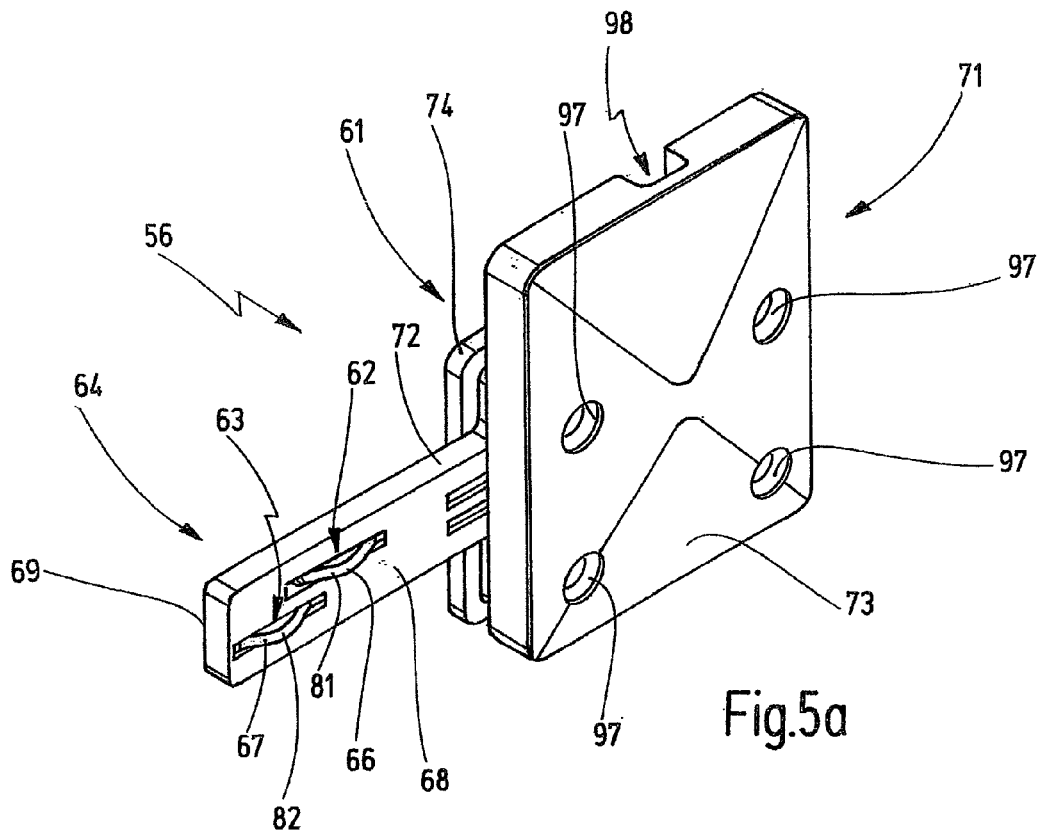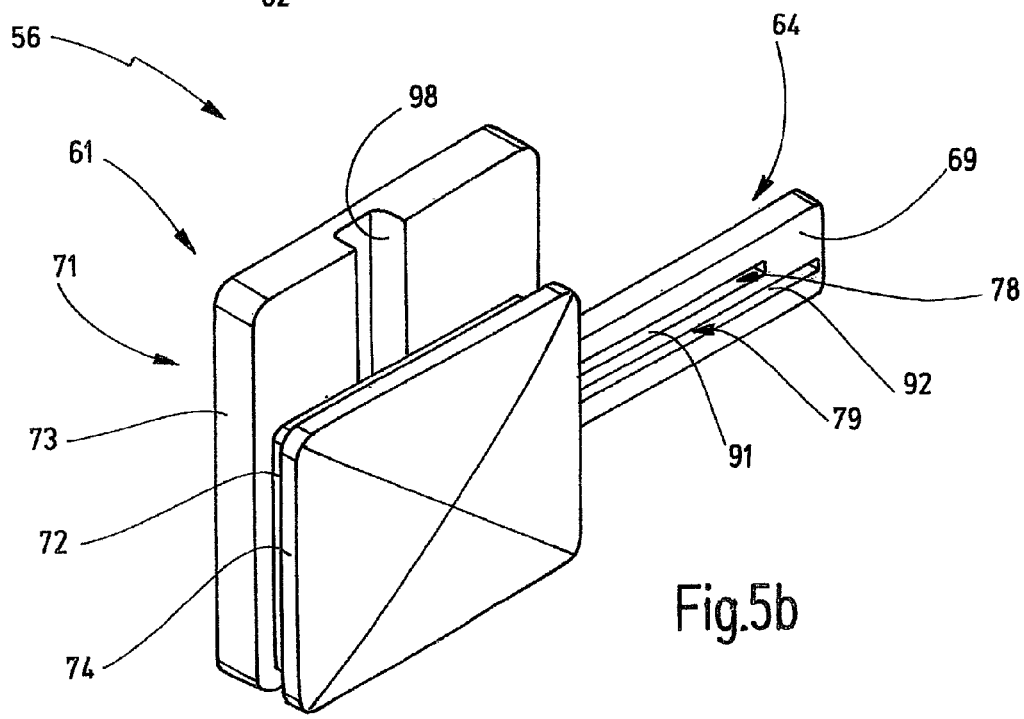

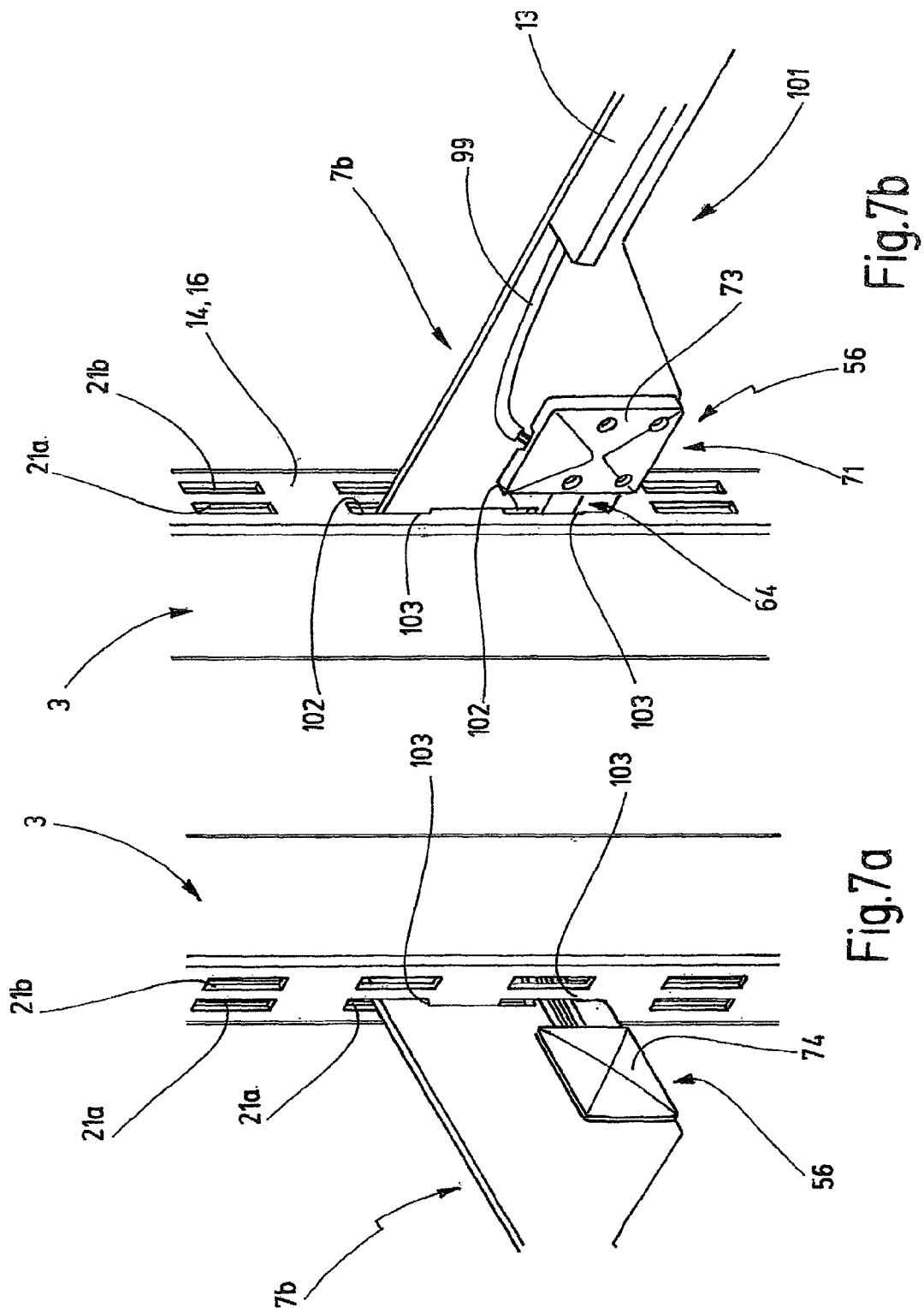

RACK SYSTEM HAVING AN ELECTRICAL SUPPLY

CROSS REFERENCE TO RELATED APPLICATIONS

This patent application is the national phase of PCT/EP2014/078073 filed Dec. 16, 2014, which claims the benefit of European Patent Application No. 14169527.0 filed May 22, 2014 and German Patent Application No. 10 2013 114 289.3 filed Dec. 18, 2013.

TECHNICAL FIELD

The present invention relates to a shelving system comprising at least one shelf rail that is vertical during use and at least one bracket for a carrier element, in particular for a shelf element, which can be fixed to the shelf rail in a height-adjustable manner, wherein the bracket or the carrier element can carry an electrical device, in particular a lighting device, which is supplied with electric energy via the shelving system.

BACKGROUND

Shelving systems of this type can be used in the shopfitting field for displaying merchandise and are known in a variety of embodiments. Frequently, cantilever racks are used, in which shelf supports designed as angle brackets for carrying shelves or other carrier elements are hooked into shelf rails so as to extend outward, the shelf rails being designed as wall rails or free-standing shelf columns or shelf uprights and having periodic punched holes for receiving the shelf brackets at varying heights. The punched holes can simply be slots that are evenly spaced from one another vertically. The shelf brackets engage with generally hook-shaped engaging sections in the slots behind the front face of the shelf rails and thereby secure the shelf brackets in the desired position. The shelf elements are fastened either at the top to the shelf brackets or to bearing sections molded thereon at a right angle.

Such shelving systems allow the storage rack to be easily assembled, disassembled, and adjusted to the particular requirements. The shelf elements and the like can be hooked in quickly and easily at any desired height.

It is furthermore known to provide electrical devices, and in particular lighting devices, such as halogen or LED luminaires, on the shelves or other carrier elements of storage racks, so as to achieve different visual effects by illuminating merchandise with light. A lighting device may be mounted, for example, on the front or a lateral bottom edge of a shelf so as to illuminate the compartment beneath. To supply energy, connecting cables must be run from the lighting device to an electrical power supply connections, such as a power outlet. Discreet, unobtrusive routing of the connecting cables is desired on shelving systems for shop-fitting purposes.

From practical experience shelving systems, in particular for wall mounting, are known, in which current-conducting bars are integrated into the vertical braces. In general, only a single inner conductor, either for the positive pole or for the negative pole in the case of a DC power supply, is accommodated in each brace so that the shelves must be connected on both sides to the two poles in different braces.

Such a shelving system is known from WO 2005/099522 A2. In this shelving system, a cartridge having a C-shaped, electrically conductive bus bar, which is connected to a single terminal of an AC power supply, in inserted into each shelf rail. A strip-shaped conductor is adhesively attached to each angle bracket and extends from a hook-shaped engaging end of the bracket to the opposite end of the same so as to establish a connection between the bus bar and a terminal of the lighting device. A circuit thus leads via two bus bars in separate shelf rails and via two brackets, which are each provided with the adhesively attached conducting strip and carry a shelf. This design is complex and cost-intensive with respect to the wiring. Moreover, the conducting strips adhesively attached to the brackets are exposed and can easily be touched, which represents an unacceptable risk for the staff and customers when it comes to store fixtures.

In addition shelving systems are known in which both conductors of a circuit are integrated into a single shelf rail, and connections in the manner of receptacles are provided in one or more locations of the shelf rail for connecting a lighting device, into which plugs or other connectors of the lighting device can be plugged. The disadvantage here, however, is that the connections can only be provided in discreet locations of a shelf rail, which not only limits the adjustability of the height of the shelves, but can also impair the aesthetics due to the visible connecting cables and plugs. Moreover, simpler handling would be desirable.

A shelving unit that is provided with a lighting device is known from DE 34 39 657 A1, in which the power supply cables are installed hidden in the cavity of the shelf rails, while the brackets for the shelves themselves are combined with the lighting device to form a structural unit and comprise contact elements, which establish the current-conducting connection to the power supply cables when the brackets are being hooked into the shelf rail. In one embodiment, two bus bars comprising contact springs are provided in the shelf rail, which are disposed offset from one another on an insulating panel that is fastened in the interior to the back wall of the shelf rail. The contact elements for tapping the current are disposed on end faces of the hook-shaped shoulders of the brackets used for hooking the brackets in the shelf rail. The connecting lines leading from the contact elements to the lighting device are installed inside the bracket. This requires specially designed brackets having a complicated and bulky configuration.

It would be desirable to be able to use conventional angle brackets made of panel-shaped material, in particular made of sheet steel or the like, which can be used in conjunction with simple slotted rails. Moreover, it would be desirable if the shelf rails could be flexibly used both for a wall-mounted installation or for free-standing racks comprising shelf elements that can be hooked into both the front and the back, and this preferably without having to pay strict attention to the installation position of the shelf rails.

SUMMARY

It is an object of the invention to create a shelving system, comprising at least one shelf rail and at least one bracket for a carrier element, in particular for a shelf element, which can be hooked into the shelf rail, and comprising an electrical connection for a lighting device or another electrical device, the shelving system having a relatively simple design and being easy to handle in terms of assembly, disassembly and modification, and meeting the functional and aesthetic requirements in particular of the shop fitting field. In particular, such a shelving system should allow the height of the individual carrier elements to be adjusted easily and quickly and to establish the connecting connection for the lighting device or the like without complexity and quickly.

Particularly advantageous embodiments are the subject matter of the dependent claims.

The shelving system according to the invention comprises at least one shelf rail, which during use is to be oriented vertically with the longitudinal extension thereof and comprises at least one front wall and two side walls, which delimit an interior of the shelf rail. One or more rows of punched holes for mounting carrier elements at varying heights are provided in the front wall of the shelf rail, wherein the punched holes are provided at a distance from one another along the shelf rail and provide access to the interior. A bus bar for supplying energy is integrated into the interior of the shelf rail, and the bus bar extends at least in sections along the shelf rail and comprises a first and a second current conductor, which extend next to and at a distance from one another along one of the side walls of the shelf rail and are insulated from one another. The shelving system furthermore comprises at least one bracket for a carrier element, such as a shelf element, which is configured to be detachably hooked into one of the punched holes of the shelf rail. The bracket includes at least one engagement section for engaging in one of the punched holes and a carrier section for a carrier element, which is connected to the engagement section and protrudes from the shelf rail when the bracket is hooked in. A current collection device, which comprises a housing having a current collection section and a connecting section connected to the current collection section, is fastened to the bracket. The current collection section is disposed on the engagement section and comprises tap contacts protruding from the housing for contacting the current conductors of the bus bar. The connecting section is disposed on the carrier section of the bracket and provided for the current-conducting connection of the tap contacts to a connecting cable of an electrical device. The tap contacts are configured to be resilient and disposed so as to be pressed into the housing against the spring force when the bracket is being hooked into the shelf rail, and out of the housing by the spring force after passing the respective punched hole in the interior of the shelf rail, and to be pressed against the first or second current conductor of the bus bar so as to establish an electrically conducting connection with these.

The shelving system according to the invention is in particular intended for displaying merchandise in the shop fitting field. It has an extremely simple design and allows easy handling during installation, teardown, and modification. The brackets are simply hooked into the appropriate punched hole at the respective desired height, wherein contacting of the inner conductors in the shelf rail by the tap contacts of the bracket according to the invention is achieved automatically, which is to say independently, without any additional actions by the operator. A carrier element, such as a shelf element comprising the lighting device provided thereon or another electrical device, can be mounted on the bracket, for example subsequently or even previously, wherein the connecting cable of the lighting device or the like is simply connected in the connecting section. The shelving system can be easily and quickly modified by simply unhooking the bracket or brackets of a respective shelf element from the associated punch hole or holes and hooking this or these into other punched holes. At the same time, the circuit for the lighting device or the like is automatically closed. Advantageously, the power supply cables for the lighting device or the like are disposed in a single bus bar and a single bracket, which represents a more cost-effective configuration having a simpler design, and allows the connection to be established more easily, compared to a conduction system that is distributed among different shelf rails and brackets. The cable lengths and the wiring complexity can be considerably reduced. The current collectors at the bracket can be run in the housing so as to be essentially invisibly to the outside and without the possibility of touching them from the outside.

The shelving system according to the invention can be designed as a wall shelf comprising a wall rail configured to be mounted on a vertical wall. The wall rail can be configured for direct mounting, such as by way of a screw connection, on the wall or for suspension from a, for example horizontal, beam or the like.

The shelf rail can also form part of a rack configured to be installed on a floor of a room. The shelf rail can be a stand-up pipe to be installed on the floor, or a shelf column or shelf upright of the rack connected to a base.

While the invention can be applied to a rack having only a single shelf rail or column, the shelving system according to the invention will generally comprise at least two shelf rails, which are disposed parallel and next to one another in the vertical orientation. A shelf element or another carrier element is then held on two or more shelf rails by way of respective brackets, wherein the power supply for a lighting device or the like takes place via only a single shelf rail comprising an integrated bus bar and a single bracket comprising an integrated current collection device.

The shelf rail can be formed by any arbitrary profiled rail having a hollow interior and one or more rows of punched holes for hooking in the brackets on at least one wall or one wall section. It can have a round, U-shaped or C-profile shaped cross-section. In a preferred embodiment of the invention, the shelf rail is a rectangular tube or profile, which is preferably made of a metallic material, in particular steel. The shelf rail then furthermore comprises a back wall, which runs parallel to and at a distance from the front wall between the side walls and includes one or more rows of punched holes that are similar or identical to the punched holes on the front wall. In this way, brackets comprising carrier elements can also be disposed in the back wall.

If the shelf rail, including the bus bar integrated therein, is designed symmetrically with respect to a center plane extending perpendicularly through the front wall and the back wall, and symmetrically with respect to a center plane extending perpendicularly through the side walls, no particular attention must be paid to the orientation of the shelf rail during assembly and modification of the shelving system. The front wall corresponds to the back wall. In this way, different racks comprising shelf elements that are cantilevered toward the front and back sides are effortless to set up.

In a preferred embodiment, the punched holes are designed in the form of preferably equidistant slots, which lead through the respective front wall and optionally the back wall of the shelf rail and are oriented in the longitudinal direction thereof. Such shelf rails comprising single rows or double rows of vertical insertion slots are particularly easy and cost-effective to produce.

The width of the insertion slots is preferably selected such that it is virtually impossible for at least a hand of an adult, preferably also a child's hand, to reach into the insertion slot, so as to effectively prevent contact with the current conductors in the shelf rail. The slot width can be a maximum of 4 to 5 mm, for example. The height of the slot may be arbitrary or can be 15 mm, 20 mm or even more, for example. Depending on the desired adjustability, the slots can be provided, for example, at a distance of 30 mm, 40 mm, 50 mm, or the like from one another, wherein smaller or larger intervals and non-equidistant slot patterns are also possible.

The bus bar integrated into the shelf rail is preferably provided for low-voltage energy supply. Low voltage in this connection shall be understood to mean in particular voltages that do not exceed the limit values of 50 volts for AC voltage and of 120 volts for DC voltage. In the latter case, the voltages are preferably likewise less than approximately 50 volts. Preferably, customary voltages of 6 volts, 12 volts or 24 volts of conventional halogen or LED systems are present. In this respect, halogen or LED luminaires form preferred lighting devices or electrical devices, which are fastened to brackets or shelf elements of the shelving system according to the invention.

In a particularly preferred embodiment, the bus bar is configured for a low-voltage energy supply of direct current and comprises at least one first current conductor for a first pole, such as a positive conductor, and a second current conductor for a second, different pole, such as a negative conductor.

If desired, the bus bar could comprise at least one phase conductor and one neutral conductor for alternating current applications, and optionally also carry a protective ground conductor. In principle, the current conductors in the bus bar of the shelf rail could also be used alone, or additionally, to transmit data.

In one embodiment, the bus bar comprises a main body made of an electrically insulating material, comprising at least one beam which is associated with at least one side wall of the shelf rail and in which the first and second current conductors of the bus bar are embedded, preferably in the form of conducting strips, parallel to and at a distance from one another such that they are separated and surrounded by the insulating material. The current conductors are then disposed recessed in relation to the insulation material that extends furthest into the interior of the shelf rail. In this way, short circuits can be largely avoided, and protection against contact from the outside can be increased.

According to the invention, the current conductors associated with a circuit (or a data transmission connection) are disposed on the at least one beam of the bus bar along a single side wall of the shelf rail, which means that the current conductors extend along the extension of the associated side wall parallel to and at a distance from the same and from one another. The current conductors may be spaced only slightly from the associated side wall, for example separated only by the thickness of the insulating material, or they can also be located at a greater distance from the associated side wall of the shelf rail, for example approximately at the center between this shelf rail and the opposing side wall, or even closer to the latter. In any case, the current conductors are exposed toward the side of the opposing side wall and accessible from this side for a current tap. The tap contacts for the current tap are guided out on the side at the engagement section of the bracket. A suitable elastically resilient configuration of the tap contacts ensures that these make contact with the current conductors with high contact reliability.

In one embodiment of the invention, the main body of the bus bar is formed by an H profile, the width and depth of which are adapted to the width and depth of the interior of the shelf rail so that the bus bar is held relatively immovably in the shelf rail, preferably by way of force fit. The H profile comprises two mutually parallel beams and a center web connecting the beams. At least one first pair of a first and a second current conductor is disposed on one of the beams, and at least one second pair of a first and a second current conductor is disposed on the other beam, such that a mirror-symmetrical and/or point-symmetrical arrangement with respect to a center point of the center web is created in each cross-sectional plane. Such a shelf rail is flexible and easy to use.

In a modified embodiment, the main body of the bus bar comprises a substantially rectangular tube profile-shaped center body, which is used for fastening in the shelf rail, and at least one beam, which projects from one side of the center body and carries two or more current conductors belonging to one circuit. The center body preferably has a width that is adapted to the width of the interior of the shelf rail, but a considerably lower depth than the interior. In this way, it is not only relatively easy to insert the bus bar into the shelf rail in the longitudinal direction of the same for installation, but also possible to maintain a sufficient force-fit connection with the same during use. As with the H profile, suitable protrusions on the main body make it possible to provide contact regions between this main body and the shelf rail that have only a narrow surface area or are line-shaped, which facilitate handling. The beam comprising the current conductors may be disposed, for example, approximately in the center of the side of the center body associated with the front wall and extend outwardly, which in the installed state is in the direction of the front wall. The current conductors are disposed at least on one surface of the beam that is oriented perpendicularly to the front wall. However, it is also possible for current conductors for different circuits or data transmission connections to be disposed on both surfaces of the beam, which are located opposite the side walls of the shelf rail. A further corresponding beam comprising current conductors is preferably formed on the opposite side of the center body, preferably likewise centrally, and accessible from the back wall or back side of the shelf rail.

The bracket according to the invention is preferably produced as an angle bracket made of a flat, panel-like material, and preferably of sheet steel. Other, including non-metallic, materials are possible. The bracket preferably comprises a flat carrier section, which during use can be supported with a supporting edge on the front wall (or back wall, depending on the arrangement) of the shelf rail, and at least one hook-shaped engagement section, which projects on the supporting edge and is configured to surround a wall delimiting the associated punched hole in a saddle-like manner. Such brackets have a simple design and are used widely. They can be cost-effectively produced.

The current collection section of the current collection device can be disposed on the hook-shaped engagement section. The bracket can thus also comprise only a single engagement section in the form of a hook.

In a preferred embodiment, the bracket comprises the first, hook-shaped engagement section and a further engagement section, which projects from the supporting edge at a distance from the first engagement section and comprises the current collection section of the current collection device. The further engagement section comprising the tap contacts of the current collection device can, but does not have to be designed as a hook. In any case, it also engages in a punched hole so as to enable additional retention on the shelf rail. Using two engagement sections, a more stable arrangement and mounting of the bracket on the shelf rail is achieved.

The distance of the engagement sections can correspond to the distance of the punched holes on the shelf rail, or be a multiple thereof.

In a particularly stable and easy-to-handle embodiment, the top engagement section of the bracket is designed as an insertion hook, while the bottom, substantially rectangular, engagement section carries the tap contacts.

For mounting carrier elements, and in particular shelf elements, the bracket can have a bearing section that is oriented perpendicularly to the carrier section. The bearing section can be disposed laterally in a central region of the bracket, or else on top of the bracket as a cross web so as to mount shelves from above on the bracket.

In a preferred embodiment, the bracket is a stamped part, which is produced in one piece, wherein the bearing section is formed by bending it out of the carrier section, and a continuous opening for receiving the housing of the current collection device is stamped out in an engagement section and the carrier section. However, the bracket can also be manufactured in another manner, such as by way of casting, forming, joining and the like.

The current collection device is disposed in the receiving opening of the bracket such that the housing extends transversely through the same and protrudes slightly on the both sides of the bracket. The tap contacts of the current collection device protrude outward from one side.

The tap contacts are preferably formed by current collectors, preferably in the form of wires, that are resiliently mounted in the housing and that are clamped with an end section in the connecting section of the current collection device, guided to the current collection section forming multiple bents, and guided out of the current collection section in a hook-shaped manner so as to form the tap contacts. The resilient mounting can in particular be provided by an inherent elasticity of the elastically bendable wires. Round wires are preferably used for the current collectors; however, flat wires, contact studs or the like may also be used. In principle, it would also be possible to use not elastically bendable contacts, and to preload these to the outside by way of suitable spring elements.

The hook shape of the current collectors at the place where the tap contacts are led out is suitably designed, such as in a U, C or V shape, so that, during introduction of the engagement section of the bracket into a punched hole, the tap contacts are transversely loaded by the side wall delimiting the punched hole and elastically deflected so far toward the housing that they can pass the side wall of the punched hole, wherein the tap contacts elastically spring out again in the interior and establish contact with the associated current conductors. The hook shape of the tap contacts likewise simplifies unhooking of the bracket by pressing the tap contacts into the housing in interaction with the side wall of the punched hole.

The housing of the current collection device according to the invention is preferably designed to completely enclose the current collectors up to the tap contacts and protect these against contact. In a preferred embodiment, a base part, which comprises the connecting section and the current collection section and includes recesses for receiving the current collectors, such as round wires, and a cover part, which is configured to be fastened to the base part, form part of the housing. The housing can preferably be injection-molded from plastic material. In any case, it is made of an electrically insulating material.

Similarly to the associated engagement section of the bracket, the current collection section can have a height that is reduced compared to the height of the punched hole so as to provide a clearance in the punched hole, which simplifies hooking in the bracket. The width of the current collection section is preferably adapted to the width of the associated engagement section and of the punched hole, so as to fit through the punched hole with little clearance. The width of the current collection section and of the engagement section, however, can also be only a fraction of that of the punched hole.

In an advantageous refinement, the base part, in the region of the connecting section, on a wide side comprises a preferably one-piece closed base plate, which closes the base part so as not to be accessible from the outside, while the base is closed toward the outside on the other wide side by the cover part. Access to the interior of the housing can be created at any time via the detachable cover part, for example in order to solder on or to connect the connecting cables of a lighting device to the current collectors.

The cover part is preferably only disposed in the region of the connecting section so as to design the current collection section sufficiently thin that it fits into the extremely narrow slotted holes. The thickness of the current collection section extending into the interior of the shelf rail, which corresponds to the thickness of the base part, is considerably smaller than the thickness of the connecting section disposed on the bracket outside the shelf rail, which is equal to the sum of the thicknesses of the base part, the base plate and the cover part. The current collection device is suitable for arbitrary shelf rails having slotted or other punched holes.

In a preferred embodiment, the thickness of the base plate, measured perpendicularly to the wide sides of the connecting section, is smaller than the thickness of the cover part. In other words, the connecting section has a non-symmetrical design in the direction perpendicular to the wide side with respect to a vertical center plane of the base part. In this way, sufficient space can be provided for accommodating the ends of the current collectors and the connecting lines of the lighting device or the like in the cover part, without the current collection device interfering with an adjoining bracket, which is hooked into an adjoining punched hole, for example, in a shelf rail having two rows of punched holes.

The shelving system according to the invention furthermore comprises one or more carrier elements, which are provided on the at least one bracket. Different elements can be used as carrier elements, such as shelves, baskets, cantilevers and the like. Preferably shelf elements are used on brackets that carry an electrical device, and in particular a lighting device, the connecting lines of which are conductively connected to the tap contacts in the connecting section. The lighting device or the like is then automatically supplied with power when the bracket provided with the tap contacts is hooked in. It is sufficient if the shelf element comprises only a single bracket having an integrated current collection device. A possible second and any further bracket, which all support the same shelf element, do not have to comprise current collection devices. Similarly, the bus bar also must only be present in a single shelf rail, and not in the other shelf rail or rails used for the same shelf element.

Further advantageous details of embodiments of the invention will be apparent from the dependent claims, the drawings, and the associated description. The invention will be described hereafter in more detail based on a drawing, which shows exemplary embodiments of the invention, which have no limiting effect whatsoever, wherein the same reference numerals are used in all figures to denote identical elements. In the drawings:

BRIEF DESCRIPTION OF THE DRAWINGS

FIGS. 5a and 5b show a current collection device according to the invention for use in the shelving system of FIGS. 1 to 4, in simplified perspective illustrations with a view of different sides;

FIGS. 7a, 7b show a section of the shelving system according to the invention comprising a bracket that is hooked into a shelf rail and includes an integrated current collection device according to the invention, in simplified perspective illustrations, with a view of different sides;

DETAILED DESCRIPTION

Figure 1:
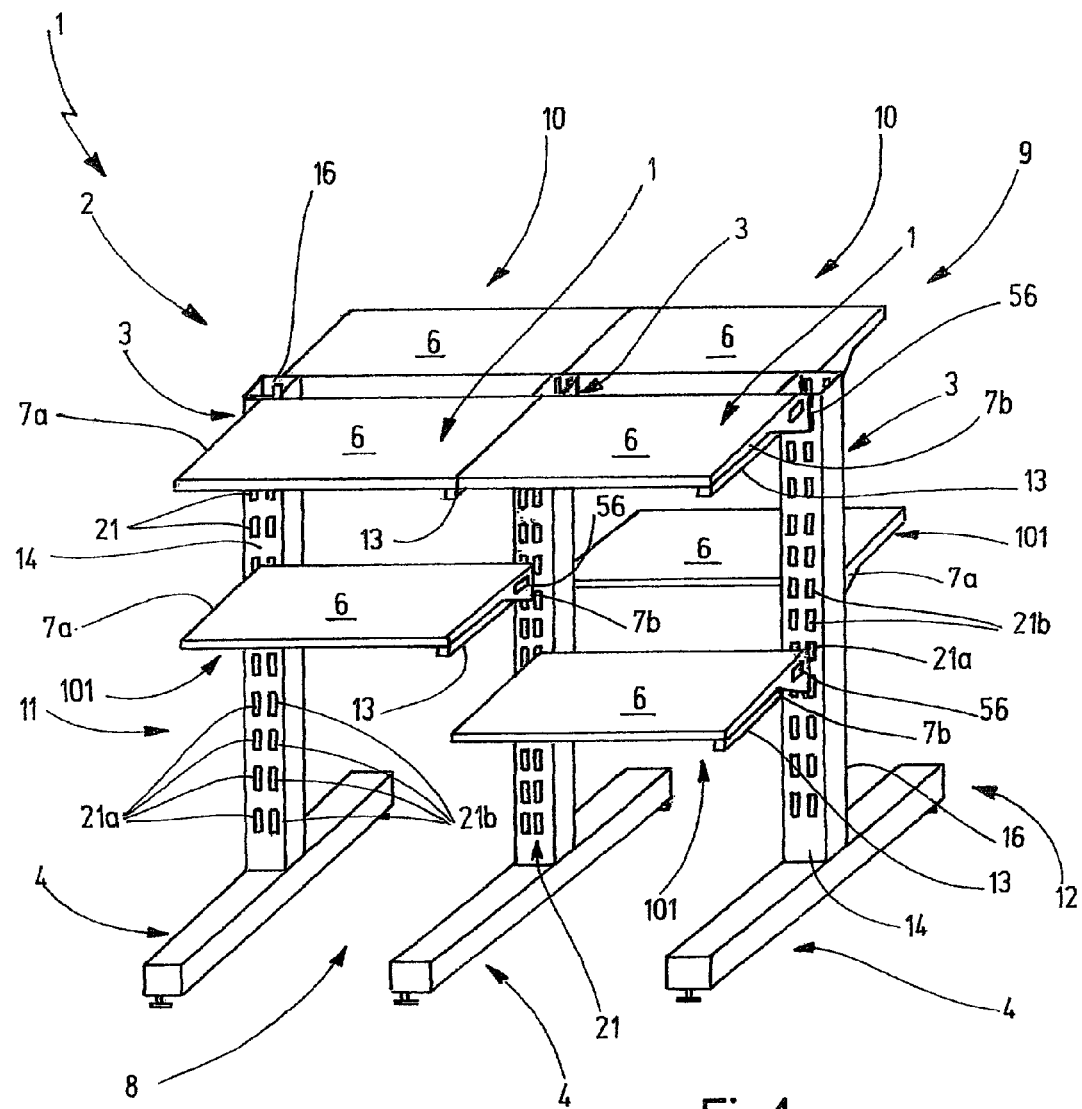
FIG. 1 shows an exemplary embodiment of a shelving system according to the invention in a drastically simplified perspective illustration.

FIG. 1 shows a shelving system denoted in the overall by reference numeral 1 in a drastically simplified perspective illustration. The shelving system 1 is in particular intended for displaying merchandise in the shop fitting field. In the exemplary embodiment shown here, the shelving system 1 comprises a shelf rack 2, which is configured here as a cantilever shelf for set-up on a floor in a set-up room, wherein the present invention can also be applied to wall shelves. Furthermore, it goes without saying that the shelving system 1 is not limited with respect to the dimensions and appearance as they can be derived from FIG. 1, so that the shelving system 1 could be designed, for example, considerably taller, wider, deeper and/or in a deviating appearance.

The shelving system 1 here comprises three shelf rails 3, which are disposed next to one another in a vertical position and are each connected at the bottom end in FIG. 1 to horizontal rails 4, which serve as pedestals. The vertical shelf rails 3 could also be disposed differently than in a line next to one another, and could also be directly supported on the floor of the installation room, wherein it is also possible to provide less or more than three vertical shelf rails 3. In the case of a wall shelf, the shelf rails 3 could be provided on a vertical wall of a room directly or by way of a suitable mounting device, such as a horizontal beam. The shelf rails 3 are described in more detail hereinafter in connection with FIGS. 2a and 2b.

As is further apparent from FIG. 1, the rack 2 comprises multiple shelf elements 6, which are disposed on the shelf rails 3 so as to be height-adjustable by way of angle brackets 7. The shelf elements 6 are formed here by panel-shaped bearing elements for the merchandise to be presented, such as bearing panels made of glass, wood, metal, plastic or another material. The shelf elements 6, however, do not have to be flat, and alternatively or additionally other carrier elements, such as baskets, cantilevers or the like, could be fastened to the shelf rails 3 by way of the brackets 7. The shelf elements 6 are fastened only on one long side to the shelf rails 3 by way of the angle brackets 7 and project from the shelf rails 3. In the present case, shelf elements 6 are provided both on the front side of the rack 2 facing the observer in FIG. 1 and on the back side of the same.

To simplify the description, the side of the rack 2 facing the observer can be referred to as the front side 8, while the side facing away from the observer is referred to as the back side 9, and the shelving system 1 furthermore has a left side 11 facing away from the observer in FIG. 1 and a right side 12 facing the observer. The sides 8 and 9, or 11 and 12 are interchangeable in each case, so that, depending on the orientation of the shelving system 1, the back side 9 could also form the front side 8.

As is further apparent from FIG. 1, lighting devices 13 are disposed on the individual shelf elements 6 on the right short side of each shelf element 6 in FIG. 1, which are used to illuminate the space located therebeneath, and in particular a shelf element 6 present therebeneath comprising merchandise displayed thereon. The lighting device 13 can be halogen or LED luminaires, for example, and are only one example of different electrical devices that can be provided as needed on the shelving system 1 according to the invention and supplied with energy via bus bars integrated into the shelf rails 3. This is described in more detail hereafter.

Figure 2A:
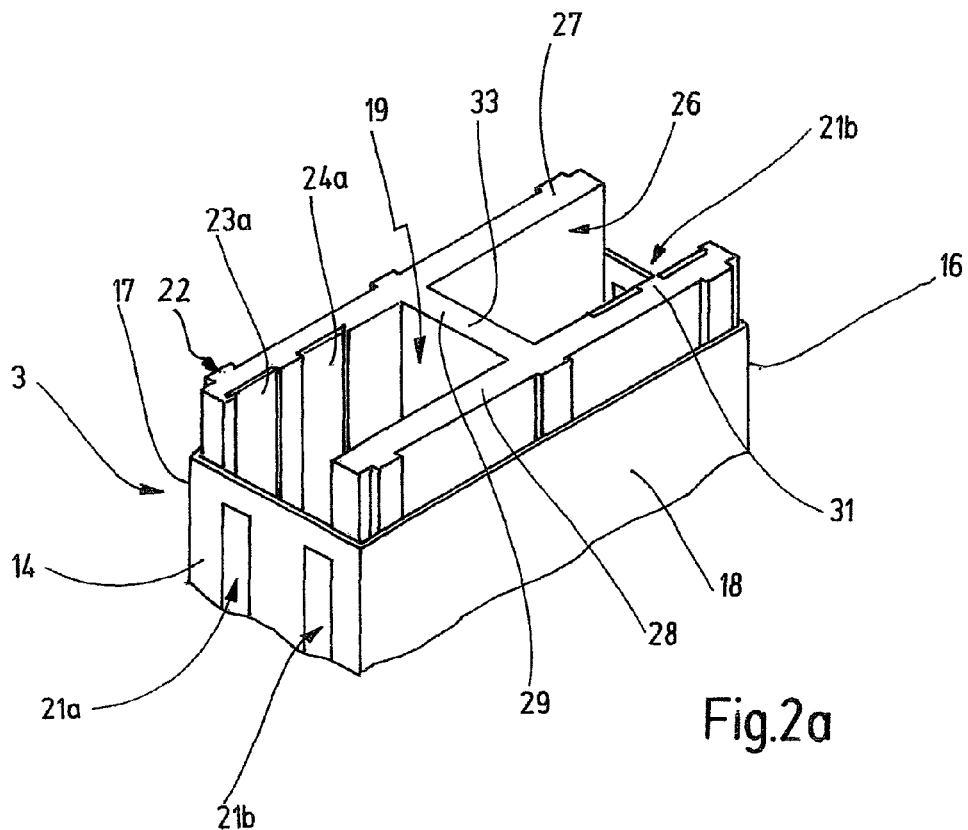
FIGS. 2a, 2b show a shelf rail comprising a bus bar integrated therein for use in the shelving system of FIG. 1 according to the present invention, in a simplified perspective illustration and in a cross-sectional view.
Figure 2B:
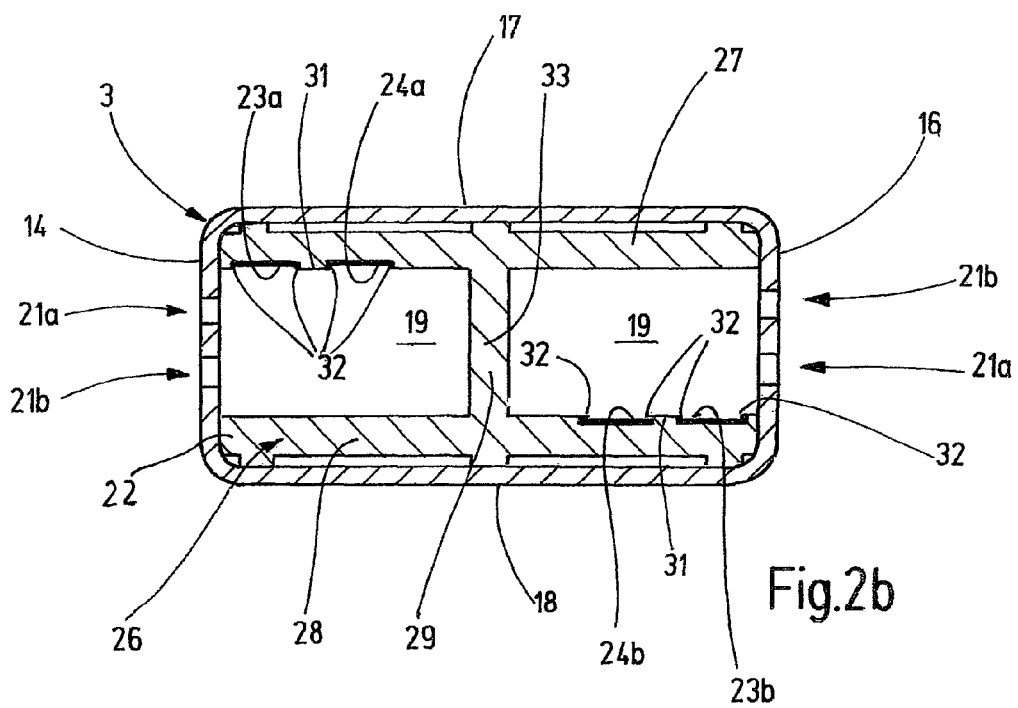

As is furthermore apparent from FIG. 1 and shown in more detail in FIGS. 2a, 2b, each shelf rail 3 is formed by a rectangular tube or profile here, which (corresponding to the directions defined in FIG. 1) comprises a front wall 14, a back wall 16, and two side walls 17, 18. The walls 14, 16, 17, 18 define an inner cavity 19 of the shelf rail 3, which has a substantially rectangular cross-section.

Each shelf rail 3 has multiple punched holes 21, which extend through the front wall 14 so as to create access to the interior 19 of the shelf rail 3. In this embodiment, two rows of punched holes 21a, 21b are provided, which in the shown vertical usage position of the shelf rails 3 are disposed next to and at a small distance from one another, wherein each row includes multiple punched holes 21a and 21b, which are disposed with regular spacing from one another. The punched holes 21a, 21b allow the shelf elements 6 or other carrier elements to be attached at varying heights of the shelving system 1 by way of the angular brackets 7.

The punched holes 21 are designed in the form of slots here, which in each case have only a small width, measured in the side direction, of approximately 4 to 5 mm, and preferably no more than such a width that a finger of at least an adult person will barely fit in the punched hole 21. This is important insofar as at least several of the shelf rails 3 are provided with a bus bar 22 for supplying energy to the lighting device 13 or another electrical device. The bus bar 22 is described in more detail hereafter.

In preferred embodiments, the slots 21 have a respective height of approximately 20 mm and are disposed with regular spacing of 30, 40 or 50 mm, for example, from one another. It goes without saying that this dimensional information is provided only by way of example and may vary, depending on the requirement.

The lighting device 13 can be attached to a bracket 7 or on a carrier element 6. As is described in more detail hereafter, the lighting device 13 is connected via the bracket 7 to the bus bar 22 disposed in the interior 19 of the shelf rail 3 so as to be supplied via the same with electric energy.

Reference is made hereafter to FIGS. 2 to 6 for describing the abovementioned components of the shelving system 1 according to the invention in more detail, wherein identical parts are each denoted by the same reference numerals. Some of the drawings are highly schematic and shown using different scales to highlight individual details. Individual features may also be omitted in individual drawings so as not to obstruct the view onto other features.

FIGS. 2a and 2b show one embodiment of the shelf rail 3 according to the invention comprising the bus bar 22 integrated therein. The bus bar 22 is configured to supply low-voltage energy here, and preferably for direct current, and comprises at least one first current conductor 23a, such as for a first pole, and a second current conductor 24a for a second, different pole of the voltage supply system, wherein the current conductors 23a, 24a belong to a shared circuit.

The bus bar 22 comprises a main body 26 made of an insulating material, into which the first and second current conductors 23a, 24a in the form of conducting strips are embedded. In the present case, the main body 26 has an H profile-shaped design and comprises two mutually parallel beams 27, 28 and a center web 29 connecting the beams. The width and depth of the H profile, measured along the width of the center web 29, or along the width of the beams 27, 28, correspond to the width and depth of the interior 19 of the shelf rail 3 in which the bus bar 22 can be captively held with little clearance. The bus bar 22 is inserted into the shelf rail 3 through an open end of the same.

The first and second current conductors 23a, 24a are disposed parallel to and at a distance from one another on the beam 27. They are embedded into the insulating material of the beam 27 such that they are separated from one another by the insulating material 31 and surrounded by protruding projections 32 of the insulating material. In this way, the surface areas of the current conductors 24a, 24b, which are open toward the interior 19, are recessed in relation to the innermost surface of the insulating material 31, 32, which ensures additional protection against contact.

The unit formed of the shelf rail 3 and the bus bar 22 integrated therein is mirror-symmetrical or point-symmetrical here in every cross-sectional plane with respect to a center point 33 of the center web 29. Insofar, a second pair of a first and a second current conductor 23b, 24b is provided on the second beam 28 of the bus bar 22 in the vicinity of the punched holes 21a, 21b of the back wall 16, wherein the current conductors 23b, 24b of the second pair are designed identical to those 23a, 24a of the first pair and are likewise embedded into the insulating material 31, 32 such that they extend parallel to and at a distance from one another and are surrounded by the projections 32 of the insulating material. In this way, it is not necessary to pay attention to the orientation of the shelf rail 3 when installing the shelving system 1 because the front wall 14 and the back wall 16 are identical. The angle brackets 7 can be fixed in the front wall 14 and/or the back wall 16, and current for a lighting device 13 or another electrical device can be tapped via the respective current conductors 23a, 24a, or 23b, 24b.

Additionally, the shelf rails 3 are preferably made of steel, aluminum, or another metal or a metal alloy, while the main body 26 of the bus bar 22 can be made of an insulating plastic material and be injection-molded.

Figure 3A:
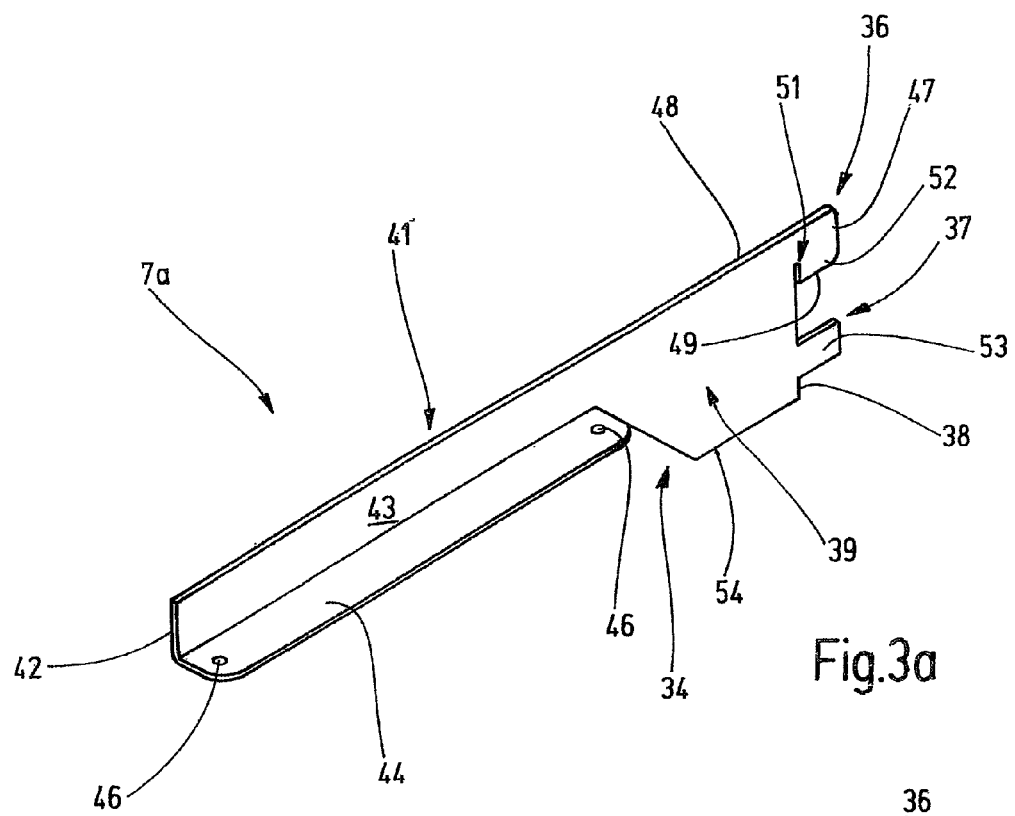
FIGS. 3a, 3b show brackets for shelf carriers for use in the shelving system of FIGS. 1 and 2, in a simplified perspective illustration.
Figure 3B:
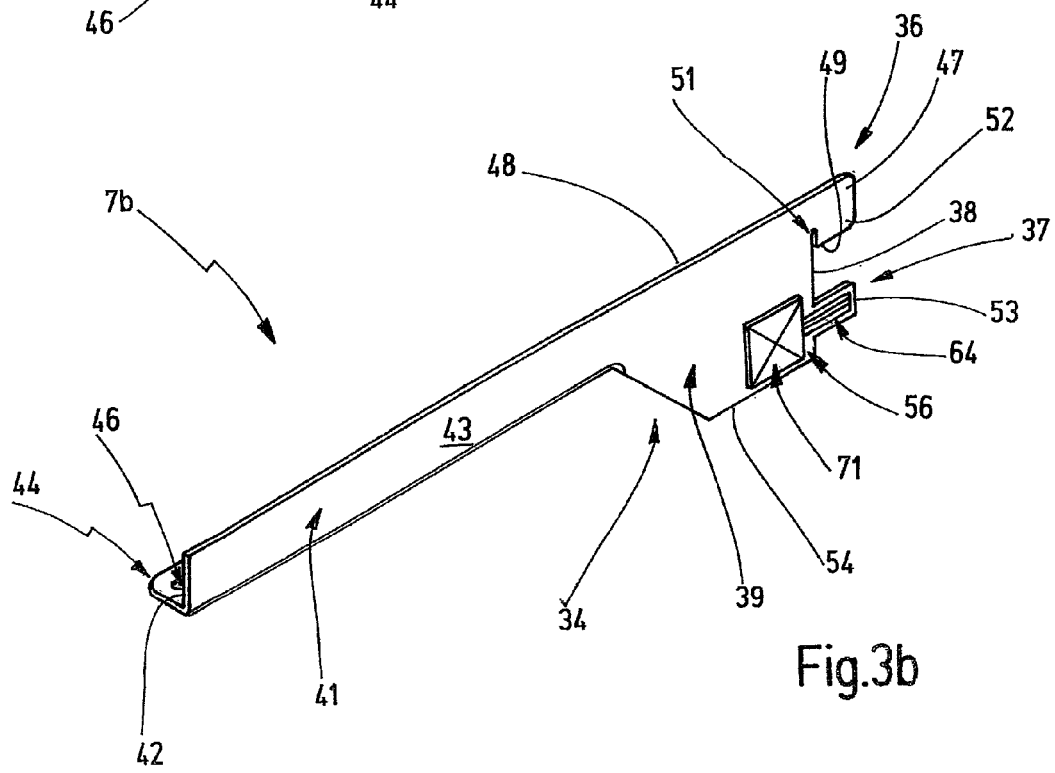

Referencing now FIGS. 3 and 4, these show preferred embodiments of the angle brackets 7 according to the invention, which here are intended in particular for receiving panel-shaped shelf elements 6. FIG. 3a illustrates a left bracket 7a, and FIG. 3b illustrates a right bracket 7b of the angle brackets 7 of FIG. 1 in an enlarged perspective illustration. As is apparent, the angle brackets 7a, 7b are formed essentially similar to each other, but laterally reversed with respect to each other from a flat, panel-like material, and preferably from sheet steel. Preferably, they are produced as stamped parts in one piece, essentially using only stamping and bending.

The first bracket 7a shown in FIG. 3a essentially comprises a carrier section 34 and a first and a second engagement section 36, 37. The carrier section 34 is configured to carry a shelf element 6 here. Proceeding from a supporting edge 38, which during use is disposed vertically and optionally is supported on the front wall 14 or the back wall 16 of the shelf rail 3, the carrier section 34 extends over a first section 39 of the carrier section 34, which in the side view is substantially trapezoidal, and a second section 41 of the same, which in the side view has the shape of an elongated rectangular beam and a reduced height compared to the first section 39, up to a free end 42 located opposite the supporting edge 38. The second, beam-shaped section 41 is bent 90° with respect to the flat surface 43 of the carrier section 34, which during use is vertically oriented, so as to form a bearing section perpendicular to the carrier section 34, which during use is horizontally oriented and used to mount a shelf element 6 or other carrier element. A shelf element 6 can bear on the bearing section 44 and be fixed on the bracket 7a by way of fastening screws, which are not shown in more detail here, through fastening holes 46 provided in the bearing section 44.

The first and second engagement sections 36, 37 each project from the supporting edge 38 and are intended to engage in corresponding punched holes 21b located on top of one another so as to secure the bracket 7a on the shelf rail 3. The first engagement section 36, which forms the top engagement section here, is designed in the form of a nose-shaped insertion hook 47, which is downwardly directed in the figures and molded on the supporting edge 38. The insertion hook 47 is essentially formed by a region that is rectangular in the side view and projects to the rear from the supporting edge 38 and that, in the vertical direction, is delimited by a top edge 48, which coincides with the top edge of the bracket 7a, and a bottom edge 49, which runs substantially at the height of the bearing section 44 and into which a small notch 51 is introduced, which separates the supporting edge 38 from a downwardly directed hook tip 52 of the insertion hook 47. When the bracket 7a is fastened to the shelf rail 3, the insertion hook 47 surrounds a bottom wall delimiting the associated punched hole 21b in a saddle-like manner, wherein the wall enters the notch 51.

The second engagement section 37 could, in principle, likewise have a hook-shaped design. To facilitate handling, however, it is designed in the form of an extension 53 that is rectangular in the side view in the present embodiment, which likewise projects to the rear from the supporting edge 38. The extension 53 is provided at a distance, which is dimensioned to fit the spacing of the punched holes 21a, 21b, from the insertion hook 47, and also at a distance from a bottom edge 54 of the first, trapezoidal section 39 of the carrier section 34. The height thereof is lower than that of the insertion hook 47 and that of a punched hole 21a, 21b, so as to allow the bracket 7a to be hooked into and unhooked from the shelf rail 3.

The bracket 7b is designed substantially similar to the bracket 7a, comprising a carrier section 34 that has a first, trapezoidal section 39 and a second, beam-shaped section 41, a bearing section 44 for a shelf element, which is oriented perpendicular to the carrier section 34, a first engagement section 36 in the form of an engagement hook 47, and a second engagement section 37 in the form of a substantially rectangular extension 53. So as to avoid repetition, reference is made to the above description of these sections and the features contained therein.

In contrast to the first bracket 7a according to FIG. 3a, the bearing section on the second bracket 7b according to FIG. 3b is bent in the opposite direction from the flat surface area 43 so that a shelf element, such as 6, can be placed between the two brackets 7a, 7b on the bearing sections 44 and be secured thereon. A further difference is that the bracket 7b here is configured to receive a current collection device 56 shown in FIG. 3b. Although the current collection device 56 here is illustrated as being provided on the bracket 7b, it could alternatively also be provided on the bracket 7a according to FIG. 3a.

Figure 4A:
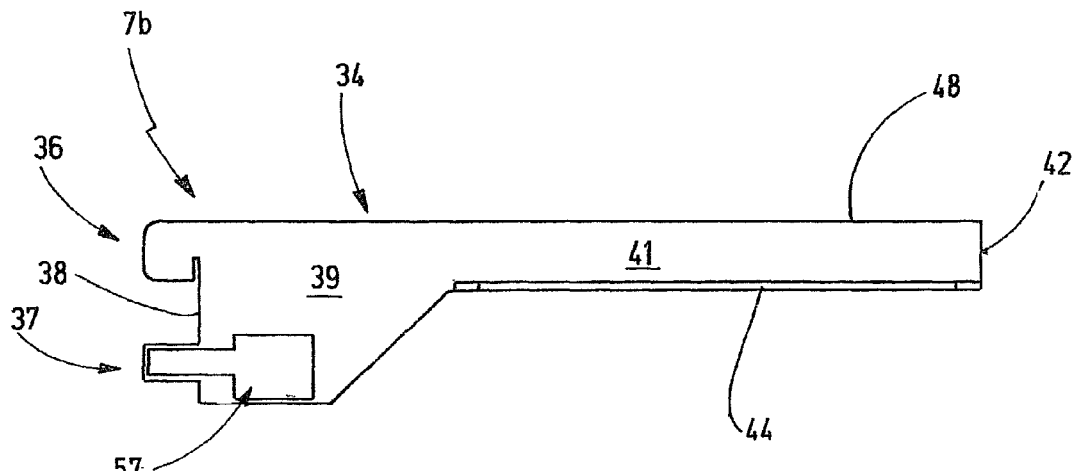
FIGS. 4a, 4b, 4c show the bracket of FIG. 3b for receiving a current collection device according to the invention, in a side view, in a top view, and in a detailed view from the side, in simplified illustrations.
Figure 4B:
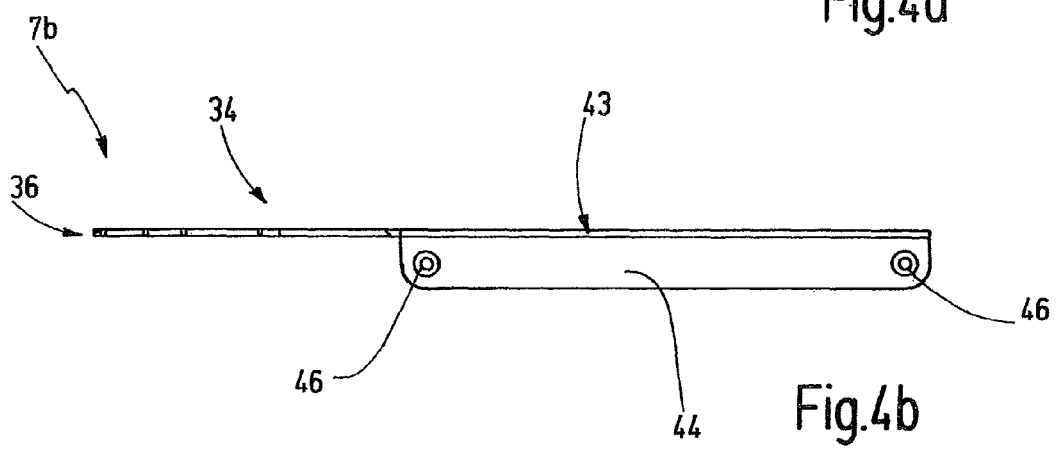
Figure 4C:
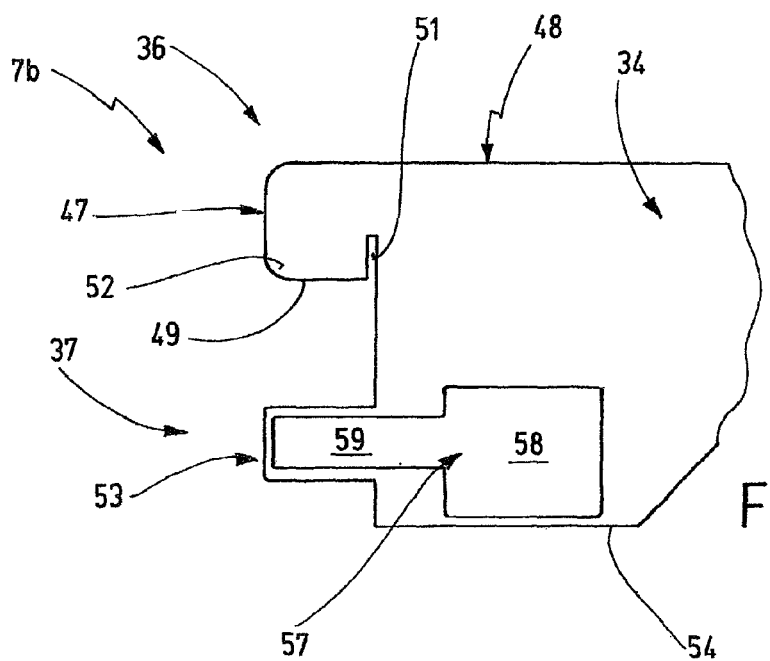

As is apparent from FIGS. 4a, 4b and 4c, which illustrate the composition of the bracket 7b in further details, the bracket 7b for receiving the current collection device 56 has an opening 57, which is generated in the panel-shaped material of the bracket 7b to as to extend through the same, such as by punching it out. The opening 57 includes a first substantially square opening section 58, and a second opening section 59, which is connected to the first opening section 58 and is substantially rectangular. The first opening section is configured in the first trapezoidal section 39 of the carrier section 34 and disposed at a small distance from the bottom edge 54 thereof. The second opening section 59 extends, proceeding from the first opening section 58, perpendicularly in the direction of the supporting edge 38 to the second engagement section 37 and substantially into the same. With the second opening section 59, the second engagement section 37 has the shape of a narrow U-shaped frame.

The opening 57, including the two sections 58 and 59, is suitably designed and dimensioned for receiving the current collection device 56. The current collection device 56 is shown in greater details as an assembled module in FIGS. 5a and 5b, and with the individual components thereof in FIGS. 6a, 6b, and 6c.

FIGS. 5a and 5b show the current collection device 56 according to the invention in simplified perspective illustrations with a view of different wide sides. The current collection device 56 in general comprises a housing 61, in which current collectors 62, 63, in the form of elastic round wires here, are disposed, which are used for tapping current on the bus bar 22 for supplying energy to the lighting device 13 or another electrical device fastened to a carrier element. As is apparent from FIG. 5a, the current collectors 62, 63 are guided out of a left housing section in FIG. 5a, which is to be denoted by current tapping section 64 here, so as to form resilient tap contacts 66, 67 for contacting the current conductors 23, 24 of the bus bar 22.

The current collection section 64 is a rectangular section of the housing 61, the configuration and size of which are adapted to the shape and size of the second opening section 59 of the opening 57 in the angle bracket 7b. When the current collection device 56 is attached to the bracket 7b, the current collection section 64 is received without clearance in the second opening section 59, wherein the wide sides 68, 69 thereof end substantially flush with the wide sides of the bracket 7b.

In addition to the current collection section 64, the housing 61 of the current collection device 56 furthermore comprises a connecting section 71, which during use is disposed on the carrier section 34 of the bracket 7b, and in particular in the first square opening section 58 of the opening 57, and is used to connect a connecting cable, which is not shown in more detail, of the lighting 13 or another electrical device to the current collectors 62, 63.

The housing 61 has a two-part design for this purpose and includes a base part 72, which comprises the connecting section 71 and the current collection section 64 and includes recesses for receiving the current collectors 62, 63, and a cover part 73, which is detachably fastened to the base part 72. FIG. 5a shows the current collection device 56 with a view onto the cover part 73, while FIG. 5b shows the current collection device 56 with a view onto a back plate or base plate 74, which is disposed on the wide side of the base part 72 facing away from the cover part 73 and closes the same there from the outside. The base plate 74 here, and preferably, is an integral part of the base part 72. The base part 74 has slightly larger dimensions than the remainder of the base part 72, so that the base plate 74 slightly overlaps the rims of the first opening section 58 when the base part 72 is disposed in the first opening section 58 in the bracket 7b. Otherwise, the base part 72 is shown in greater detail in FIG. 6a, wherein the current collectors 62, 63 are illustrated in greater detail in FIGS. 6b and 6c.

Figure 6A:
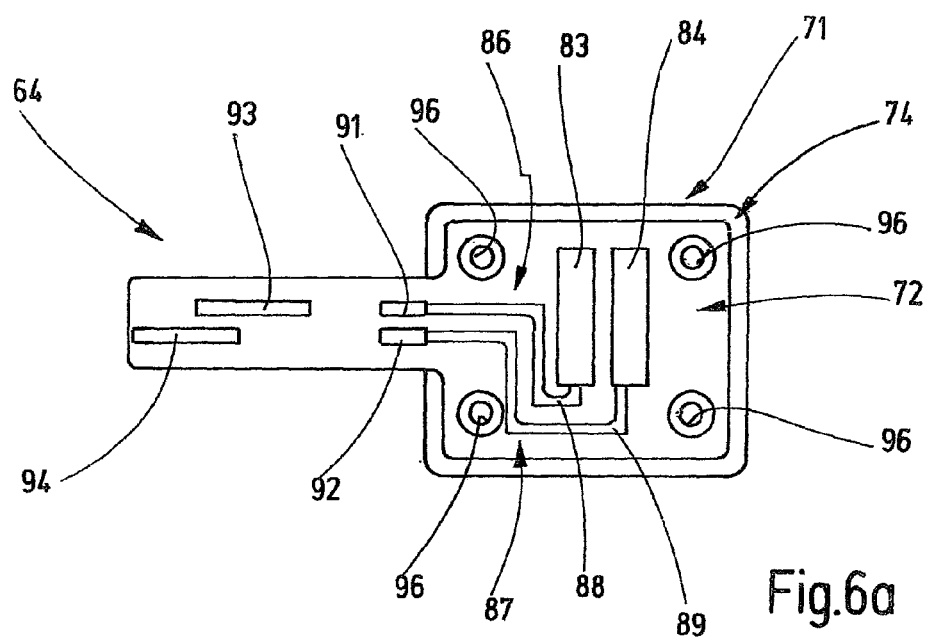
FIGS. 6a, 6b, 6c show components of the current collection device of FIG. 5 in a top view, in simplified isolated illustrations.
Figure 6B:
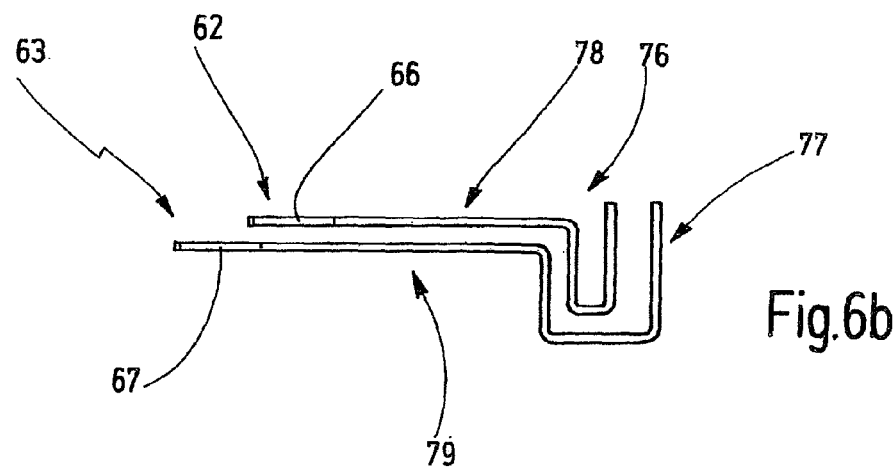
Figure 6C:
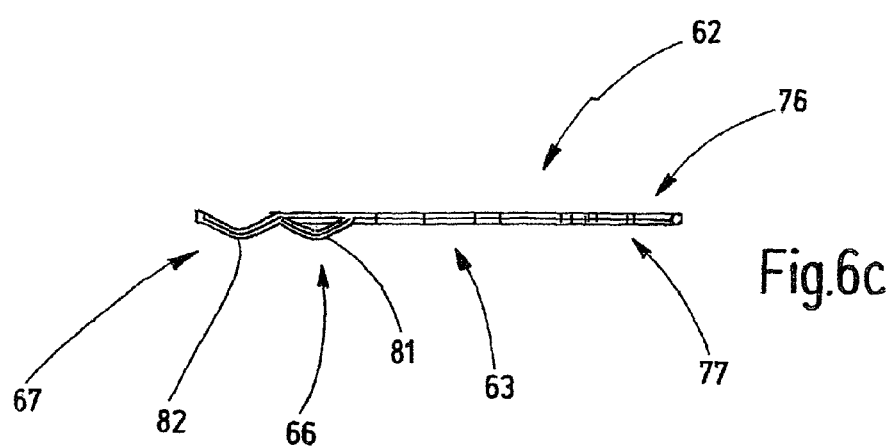

As is apparent from FIGS. 6b and 6c, the current collectors 62 are formed by wires 62 that are bent multiple times, which here are round wires, but could also be formed by flat wires. At one end, the wires 62, 63 are bent into a U shape 76, 77, wherein the U-shaped section 76 of the first wire 63 is greater than that 77 of the second wire 64. The sections 76, 77 transition into substantially rectilinear sections 78, 79, the ends of which are bent into U- or V-shaped hooks 81, 82, which form the tap contacts 66, 67. In the shown example, the rectilinear section 78 of the first wire 63 is dimensioned slightly shorter than the rectilinear section 79 of the second wire 64, so that the hooks 81, 82 in the current collection section 64 are disposed next to and at a distance from one another, the distance corresponding to the distance of the current conductors 23, 24 in the bus bar 22.

The wires 63, 64 are accommodated in the base part 72 in recesses, which are adapted to the shape and size of the wires 63, 64, so as to receive and guide these. In particular, the base part 72 comprises two larger rectangular recesses 83, 84 for this purpose, which receive the ends of the U-shaped sections 76, 77 of the wires 63, 64 and which also receive the cable ends of a connecting cable of the lighting device 13, so as to connect these to the ends of the wires 63, 64, for example by way of soldering. It would also be possible to provide insulation displacement connectors or other means in the recesses 83, 84 so as to simplify a connection of the connecting lines of the lighting devices 13 or of another electrical device to the current collectors 62, 63.

Proceeding from the recesses 83, 84, channels 86, 87 are integrally formed in the base part 72, which are adapted to the progression of the wires 63, 64, so that these can be accommodated in the channels 86, 87. In particular, the channels 86, 87 comprise U-shaped channel sections 88, 89, which accommodate the U-shaped sections 76, 77 of the wires 63, 64 by means of clamping, and rectilinear sections 91, 92, which follow the U-shaped channel sections 88, 89 and run along the current collection section 64 so as to receive the rectilinear wire sections 78 or 79. In the vicinity of the free end of the current collection section 64, the rectilinear channel sections 91, 92 are guided laterally to the outside in the form of channel openings 93, 94, through which the U- or V-hook-shaped tap contacts 66, 67 protrude from the base part 72 or the housing 61 beyond the wide side 68 to the outside.

Due to the inherent elasticity and clamping in the connecting section 71, the current collectors or wires 62, 63 are resiliently mounted such that they, when loaded by an external force on the tap contacts 66, 67, can be pressed into the base part 72 against the spring force until they are completely accommodated in the housing 61, wherein they are pressed outwardly again, out of the base part 72, by the spring force or inherent elasticity when the load is removed.

Furthermore, threaded holes 96, which are used to fasten the cover part 73 to the base part 72, are provided in the connecting section 71 of the base part 72.

The cover part 73 is a substantially rectangular solid cover when viewed from above, which includes counter bored holes 97 that are aligned with the threaded holes 96 of the base part 72 and allow the cover to be fastened to the wide side of the base part 72 facing away from the base plate 74 by way of screw bolts so as to close the recesses 83, 84, 88, 89 and fixedly clamp the wires 63, 64 therein. When the current collection device 56 is inserted into the opening 57 of the bracket 7b and the cover part 73 is fastened to the base part 72, the rim of the cover part 73 overlaps the rim of the opening 57, which is then clamped between the base plate 74 and the cover part 73.

As is also apparent from FIGS. 5a and 5b, the cover part 73 includes an elongated connecting channel 98, which, as is apparent from FIG. 7b, can receive a connecting cable 99 of the lighting device 13 or of another electrical device and route the lines thereof to the recesses 83, 84 for connection to the wires 63, 64. The lighting device 13 or another electrical device can be fastened to the bracket 7b, or, for example, to a shelf element 6 selectively on the short side or long side thereof, depending on what is desired or required.

The handling and operating principle of the above-described shelving system 1 according to the illustrated embodiment will now be described, additionally considering FIGS. 7 and 8.

It is assumed that the bus bars 22 have already been introduced into the shelf rails 3 according to the invention in the manner illustrated in FIGS. 2a and 2b. It is furthermore assumed that a rack 2, similar to that shown in FIG. 1, has been installed using the shelf rails 3, in which two or more shelf rails were installed on feet 4 next to and at a distance from one another and the relative positions thereof with respect to one another were fixed by way of suitable means, which are not shown in greater detail here, such as cross braces or the like. Alternatively, the shelf rails 3 can also have been fastened in a vertical position on a vertical wall of a room. It is furthermore assumed that the shelf elements 6 were already fastened to the bearing sections 44 of the associated brackets 7a, 7b, and that a lighting device 13 or another electrical device is mounted on the angle brackets 7b or the shelf elements 6.

Figure 8A:
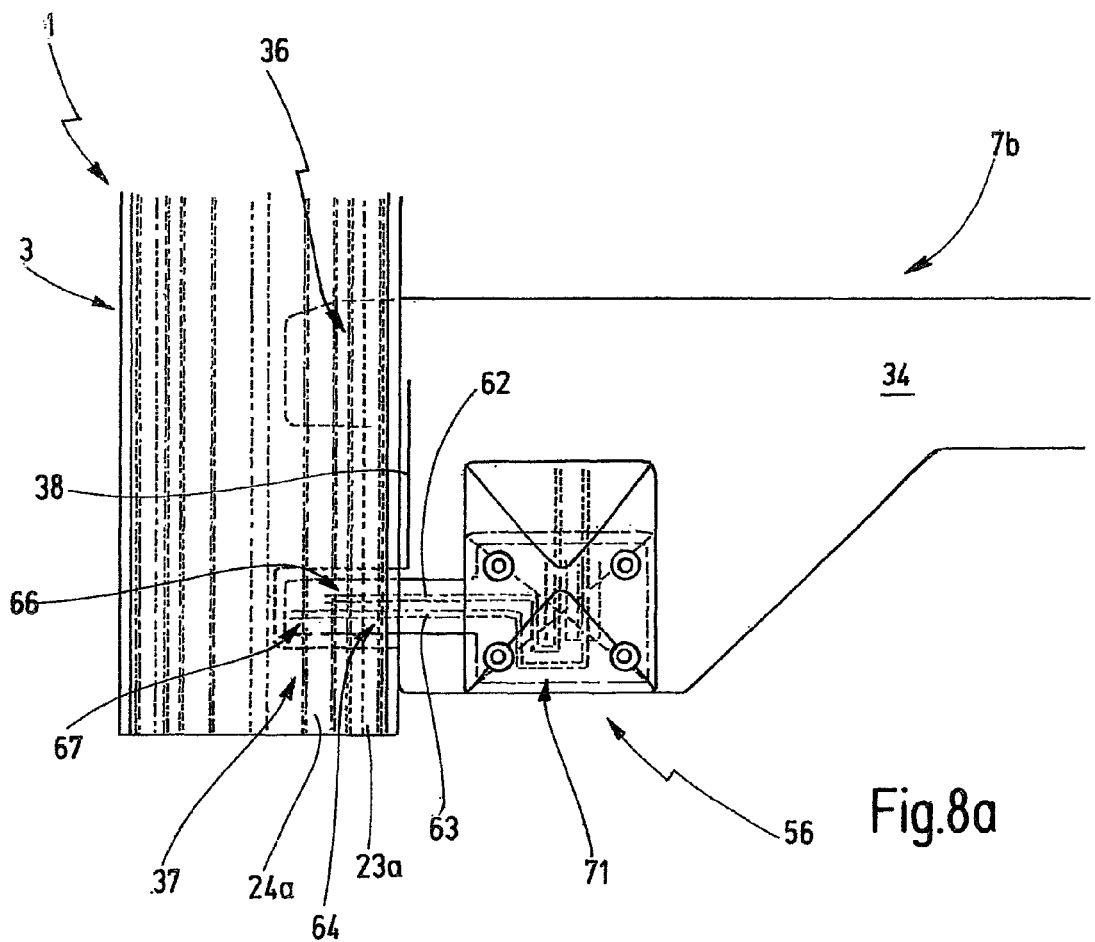
FIGS. 8a, 8b show a section of the shelving system according to the invention comprising a bracket that is hooked into a shelf rail and includes an integrated current collection device according to the invention, in drastically simplified illustrations, in a side view and in a view from above.
Figure 8B:
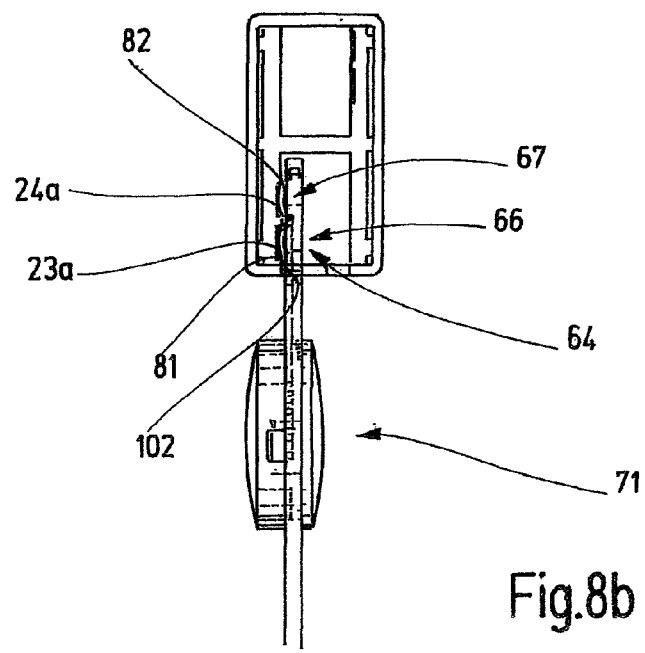

The shelf units 101 thus formed can then be hooked into the desired punched holes 21a, 21b of two adjoining shelf rails 6. For this purpose, the brackets 7a, 7b of a shelf unit 101 are introduced substantially horizontally or slightly obliquely from above into the associated punched holes 21b, 21a of a first or second shelf rail 3. As soon as the second tap contact 67 of the current collection device 56 on the bracket 7b engages with the left wall 102 in the present example, which delimits the punched hole 21a, the tap contact 67 is pressed, due to the U or V hook shape thereof, by the wall 102 into the channel opening 94 against the spring force counteracting as a result of the inherent elasticity. The second tap contact 67 is thus pressed into the housing 61 so far that it can pass the wall 102 when the bracket 7b is pushed in further, whereupon the tap contact is pressed out of the channel opening 94 again by the spring force. The second tap contact 67 is then located approximately at the level of the first current conductor 23a. When the bracket 7b is pushed in further, the first tap contact 66 engages with the left wall 102 and is pressed, due to the U or V hook shape thereof, by the wall 102 inward into the channel opening 93 so far that the first tap contact 66 can also pass the wall 102 when the shelf unit 101 is pushed in further and is then pushed out of the housing 61 in the interior 19 by the spring force. In this position, as is also shown in FIGS. 8a and 8b, the first and second tap contacts 66 and 67 are located opposite the first and second current conductors 23a and 24a (or else 23b, 24b) and are sufficiently elastically pressed against these to establish a secure contact.

The brackets 7a, 7b can subsequently be lowered and brought into the final position shown in FIGS. 7a, 7b and 13a, in which the insertion hook 47 surrounds the delimiting wall 103 of the punched hole 21a, which is the bottom wall in the figures and enters the notch 51, in a saddle-like manner and bears thereon. The extension 53 forming the second engagement section 37 likewise bears on the bottom delimiting wall 103 of the associated punched hole 21a, while the supporting edge 38 is supported on the front wall 14 or is spaced therefrom only little. The lighting device 13 can then be switched on and illuminate the space of the shelf element 6 located thereabove or therebeneath. In the case of a DC voltage supply, the shelf unit 101 can also be hooked into the shelf rail 6 with the lighting device 13 or the like already switched on when the second current conductor 24a, 24b, which is disposed deeper in the interior 19 and with which the second tap contact 67 makes contact last, is connected to the positive pole of the power supply. The current collection device 56 according to the invention then closes the circuit for the lighting device 13.

A shelf unit 101 can just as easily be unhooked and rehooked at a different height. For this purpose, the shelf unit 101 is lifted slightly until the bottom delimiting wall 103 of the punched hole 21a emerges from the notch 51, and the insertion hook 47 is aligned with the punched hole 21a. The shelf element 6, together with the brackets 7a, 7b, can then be pulled horizontally out of the punches holes 21a, 21b. This pulling out motion initially causes the electrical contact between the tap contacts 66, 67 and the current conductors 23a, 24a (or 23b, 24b) to be automatically interrupted when these become disengaged. Thereafter, first the first tap contact 66 and then the second tap contact 67 consecutively engage with the inside of the left delimiting wall 102 of the punched holes 21a and are elastically bent by the same in each case against the spring force and pressed into the housing 61, wherein these, once they have passed the left delimiting wall 102, spring out of the housing 61 again. The process of hooking the shelf unit 101 at a different height takes place in the manner already outlined above.

The shelving system 1 according to the invention is very easy to handle. Hooking in and unhooking the shelf elements or other carrier elements are carried out in the customary manner, wherein the tap contacts needed for the electrical supply are established or interrupted at the same time. The brackets 7a, 7b according to the invention can be created in an extremely slim manner, thus matching shelf rails 3 having very narrow insertion slots. The shelving system 1 has simple components and can be produced cost-effectively.

A further advantageous embodiment can be derived from FIGS. 5a, 5b and 13b. As is apparent, the thickness of the base plate 74 of the current collection device 56 is less on the right side of the bracket 7b in the figures, as measured in the transverse direction perpendicular to the surface 54 of the bracket, than the thickness of the cover part 73. This minor interfering contour of the base plate 74 is advantageous insofar as then a further bracket 7a of another shelf unit 101 can be inserted without difficulty into the adjoining punched hole 21b of the two-row shelf rail 3, without this being impaired by the current collection device 56 according to the invention.

Numerous modifications are possible within the scope of the invention. As mentioned above, the shelf rail 3 can have a single-row or double-row design, and the punched holes 21a, 21b can have different shapes, dimensions and distances from one another. The brackets 7a, 7b can likewise have different designs, including a double-walled design. It is possible for the two engagement sections 36, 37 to be designed in the form of hooks, which engage the respective bottom delimiting wall 103 of the slot 21. It is also possible to dispose the current collection device 56 on the top insertion hook 47, wherein the arrangement on the bottom second engagement section 37 considerably facilitates handling, in particular when this section is not designed as an insertion hook. As mentioned above, the shelving system 1 according to the invention can be used to create different free-standing racks or to set up entire wall systems.

Figure 9:
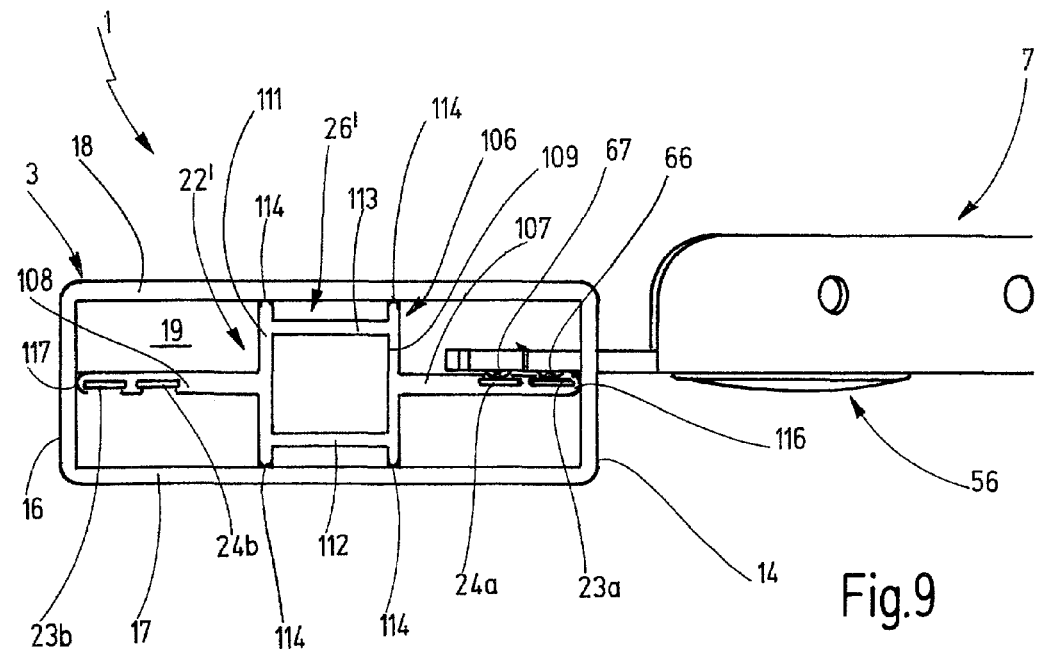
FIG. 9 shows a top view from above onto a bracket having an integrated current collection device and a shelf rail comprising a modified embodiment of a bus bar, in simplified illustrations, in a partial view, and in a detailed illustration, using an enlarged scale.

In a modified embodiment, as shown in FIG. 9, the main body 26' of the bus bar 22' comprises a substantially rectangular tube profile-shaped center body 106, which is used for fastening in the shelf rail 6 and comprises the sides 109, 111, 112, and 113. The main body 26' further comprises at least one beam 107, which projects from the side 109 of the center body 106 and carries two or more current conductors 23a, 24a belonging to one circuit. The center body 106 preferably has a width that is adapted to the width of the interior 19 of the shelf rail 3, but a considerably lower depth than the interior 19. In this way, it is not only relatively easy to insert the bus bar 22' into the shelf rail 3 in the longitudinal direction of the same for installation, but also possible to maintain a sufficient force-fit connection with the same during use. As with the H profile 22 of FIGS. 2a, 2b, suitable protrusions on the main body 26' make it possible to provide contact regions 114, 116, 117 between this main body 26' and the shelf rail 3 that have only a narrow surface area or are line-shaped, which facilitate handling. The beam 107 comprising the current conductors 23a, 24a may be disposed, for example, approximately in the center of the side 109 of the center body 26' associated with the front wall 14 and extend outwardly, which in the installed state is in the direction of the front wall 14. The current conductors 23a, 24a are disposed at least on one surface of the beam 107 that is oriented perpendicularly to the front wall 14. However, it is also possible for current conductors 23a, 24a for different circuits or data transmission connections to be disposed on both surfaces of the beam 107, which are located opposite the side walls 17, 18 of the shelf rail 3. A further corresponding beam 108 comprising current conductors 23b, 24b is preferably formed on the opposite side 111 of the center body 106, preferably likewise centrally, and accessible from the back wall or back side 16 of the shelf rail 3.

Figures 10A, 10B:
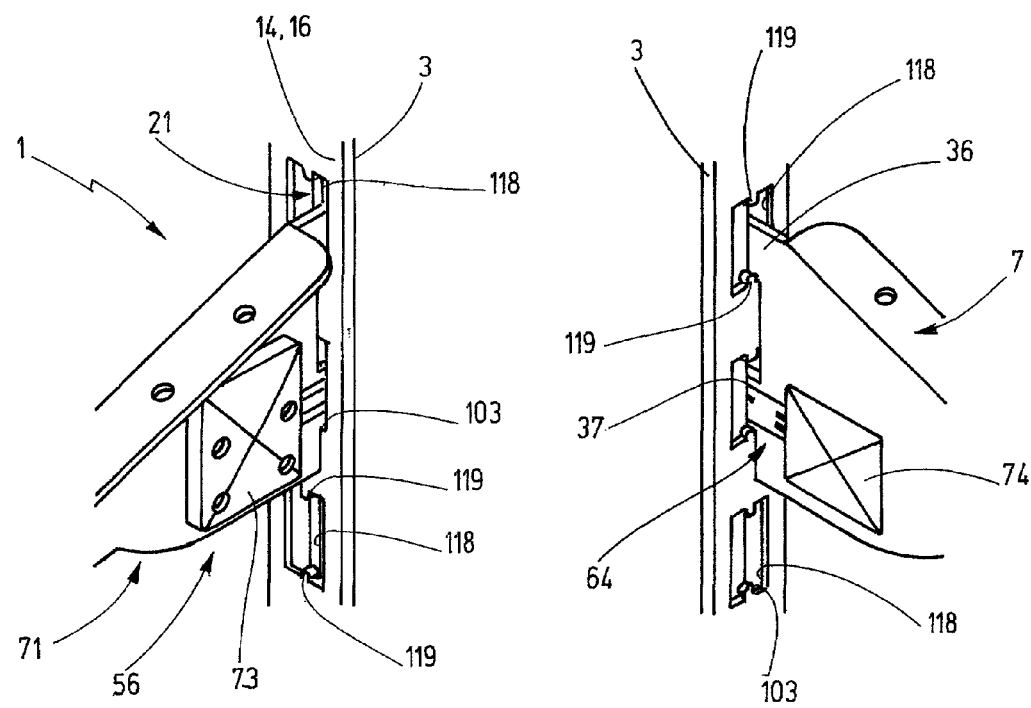
FIGS. 10a and 10b shows a section of a shelving system according to the invention comprising a bracket that is hooked into a shelf rail and includes an integrated current collection device according to the embodiments of FIGS. 9a and 9b, in simplified perspective illustrations, with a view of different sides.

As may be seen from the FIGS. 10a and 10b, the shelf rail 3 may comprise substantially rectangular punched holes 21. Two short elevations 119 are provided, which protrude toward each other from the bottom delimiting wall 103 and the opposite top delimiting wall of each punched hole 21 approximately in the middle of their transverse width. A bracket 7 may be received in a part section of the punched hole 21 between the elevations 119 and a side wall 118 of the punched hole 21

A shelving system 1, in particular for displaying merchandise, comprises at least one vertically oriented shelf rail 3 having a row of vertical slots 21, which are disposed at a distance from one another and lead to an interior 19 of the shelf rail 3. In the interior 19, a bus bar 22 for supplying energy is disposed, which comprises a first and a second current conductor 23, 24, which run next to and at a distance from one another along one of the side walls 17, 18 of the shelf rail 3 and are insulated from one another. A carrier element, such as a shelf element 6, is mounted on a bracket 7, which is configured for being hooked into the slots 21 of the shelf rail 3, wherein a lighting device 13 is attached to the carrier element 6 or the bracket 7. The bracket 7 comprises at least one engagement section 37 for engaging in one of the slots 21. Furthermore, a current collection device 56 is fastened to the bracket 7, the current collection device comprising tap contacts 66, 67 that protrude from a housing 61 and are disposed on the engagement section 37 of the bracket 7. The tap contacts 66, 67 are configured to be resilient and disposed such that they are elastically pressed into the housing 61 against the spring force as the bracket 7 is being hooked into the shelf rail 3, and are pressed out of the housing 61 by the spring force as soon as they are located in the interior 19 of the shelf rail 3, and pressed against the associated current conductors 23, 24 of the bus bar 22 in order to establish an electrically conducting connection for the lighting device 13.

The invention claimed is:
1. A shelving system, comprising:
at least one shelf rail (3) comprising at least one front wall (14) and two side walls (17, 18), which delimit an interior (19) of the shelf rail (3), wherein the front wall (14) includes one or more rows of punched holes (21) for mounting carrier elements (6) at varying heights, wherein the punched holes (21) are disposed along the shelf rail (3) at a distance from one another and create an access to the interior (19);
a bus bar (22, 22') configured to supply energy and integrated into the interior (19) of the shelf rail (3) and extending at least in sections along the shelf rail (3), the bus bar comprising:
a main body (26, 26') made of an insulating material and comprising a beam (27, 28; 107,108) which is associated with and extending substantially parallel to at least one of the two side walls (17, 18) of the at least one shelf rail (3), and
a first and a second current conductor (23, 24), which extend next to and at a distance from one another along the shelf rail (3) and are insulated from one another;
at least one bracket (7), which is configured to be detachably hooked into at least one of the punched holes (21) of the shelf rail (3), wherein the bracket (7) comprises at least one engagement section (36, 37) configured to hook the bracket (7) into the shelf rail (3) by being inserted through at least one of the punched holes (21) in the front wall (14) into the interior (19) of the shelf rail (3) to be disposed within the interior (19), and a carrier section (34) for a carrier element (6), wherein the carrier section (34) is configured to protrude from the shelf rail (3) when the bracket (7) is hooked into the shelf rail (3); and a current collection device (56), which is fastened to the bracket (7) and comprises a housing (61) having a current collection section (64) that is disposed on the engagement section (36, 37) of the bracket (7) and includes tap contacts (66, 67) protruding from the housing (61) for contacting the first and second current conductors (23, 24) of the bus bar (22), and which comprises a connecting section (71) that is disposed on the carrier section (34) of the bracket (7) to connect the tap contacts (66, 67) to a connecting cable (99) of an electrical device (13);

wherein the tap contacts (66, 67) are configured to be resilient and disposed so as to be pressed into the housing (61) against a spring force when the bracket (7) is being hooked into the shelf rail (3), and to be pressed out of the housing (61) and against the first or second current conductor (23, 24) by the spring force so as to establish an electrically conducting connection when the tap contacts (66, 67) are disposed within the interior (19) behind the front wall (14) after passing one of the punched holes (21).

2. The shelving system according to claim 1, wherein the shelf rail (3) is formed by a rectangular profile and comprises a back wall (16), which runs parallel to and at a distance from the front wall (14) and includes one or more rows of back wall punched holes (21) for mounting carrier elements at varying heights, wherein the back wall punched holes (21) are disposed along the shelf rail (3) at a distance from one another and create an access to the interior (19), wherein the shelf rail (3) is designed symmetrically with respect to center planes extending perpendicularly through the front wall (14) and perpendicularly through the side walls (17, 18).

3. The shelving system according to claim 1, wherein the punched holes (21) form equidistant slots (21a, 21b), which extend through the front wall (14) of the shelf rail (3), and are oriented in a longitudinal direction thereof.

4. The shelving system according to claim 1, wherein the bus bar (22, 22') is configured to supply low-voltage energy, and comprises at least one first current conductor (23a; 23b) having a first polarity and a second current conductor (24a; 24b) having a second, different polarity, which belong to a shared circuit.

5. The shelving system according to claim 1, wherein the first and the second current conductor (23, 24) extend parallel to and at a distance from one another and are each embedded to be surrounded by the insulating material (31, 32).

6. The shelving system according to claim 5, wherein the main body (26) is formed by an H profile, having a width and depth adapted to a width and depth of the interior (19) of the shelf rail (3) and which comprises the beam (27) and a second beam (28) parallel to the beam (27) and a center web (29) connecting the two mutually parallel beams, wherein a first pair of the first and the second current conductor (23a, 24b) is disposed on one of the two mutually parallel beams (27), and a second pair of a first and a second current conductor (23b, 24b) is disposed on another of the two mutually parallel beams (28) so as to be mirror-symmetrical with respect to a center point of the center web (29).

7. The shelving system according to claim 5, wherein the main body (26') comprises a substantially rectangular tube profile-like center body (106), which is configured for fastening in the shelf rail (3), and the beam (107), which projects from a side (109) of the center body (106) associated with the front wall (14) and carries the first and the second current conductors (23a. 24a), wherein a further beam (108) comprising a second pair of current conductors (23b, 24b) is provided on an opposite side (111) of the center body (106).

8. The shelving system according to claim 1, wherein the bracket (7) is designed as an angle bracket made of a flat, panel-like material and comprises a flat carrier section (34), which is configured to be supported with a supporting edge (38) on the front wall (14) of the shelf rail (3), and at least one engagement section (36) comprising an insertion hook (47), which projects on the supporting edge (38) and is configured to surround a wall delimiting the engaged punched hole (21) in a saddle-like manner.

9. The shelving system according to claim 8, wherein the current collection section (64) of the current collection device (56) is disposed in the insertion hook (47).

10. The shelving system according to claim 8, wherein the bracket (7) comprises a first engagement section (36) comprising the insertion hook (47) and a further engagement section (37), which projects from the supporting edge (38) at a distance from the first engagement section (36) and in which the current collection section (64) of the current collection device (56) is disposed.

11. The shelving system according to claim 1, wherein the bracket (7) comprises a bearing section (44) that is oriented perpendicularly to the carrier section (34) and provided for mounting a shelf element (6), wherein the bracket (7) is produced in one piece, and the bearing section (44) is bent out of the carrier section (34), and an opening (57) for receiving the housing (61) of the current collection device (56) is stamped out in the at least one engagement section (36, 37) and the carrier section (34).

12. The shelving system according to claim 1, wherein the tap contacts (66, 67) of the current collection device (56) are provided on current collectors (62, 63) that are resiliently mounted in the housing (61) and that are clamped in the connecting section (71), guided to the current collection section (64) and guided out at the current collection section (64) in a hook-shaped manner so as to form the tap contacts (66, 67).

13. The shelving system according to claim 12, wherein a base part (72), which comprises the connecting section (72) and the current collection section (64) and includes recesses (83-92) for receiving the current collectors (62, 63), and a cover part (73), which is configured to be detachably fastened to the base part (72) and guide a connecting cable (9) of the electrical device (13) from the outside to the interior of the base part (72), form part of the housing (61) of the current collection device (56).

14. The shelving system according to claim 13, wherein the base part (72), at or near the connecting section (71), on a wide side, comprises a base plate (74) formed one piece with this connecting section, and on the other wide side is closed by the cover part (73) so as not to be accessible from outside, wherein a thickness of the base plate (74), measured perpendicularly to the wide sides, is smaller than a thickness of the cover part (73).

15. The shelving system according to claim 1, further comprising at least one shelf element (6), which is configured to be fastened to the at least one bracket (7a, 7b), wherein the shelf element (6) or the bracket (7a, 7b) carries the electrical device (13), the connecting cable (99) of which is electrically connected in the connecting section (71) of the current collection device (56) to the current collectors (62,

63), wherein the shelf element (6) is configured to be fastened to a first bracket (7*b*) comprising the current collection device (56) and to a second bracket (7*a*) not comprising a current collection device, and the current collection device (56 is configured to provide an electrical connection for the electrical device (13).

\* \* \* \* \*